United States Patent [19]

Sumida

[11] 4,250,401
[45] Feb. 10, 1981

[54] DATA INPUT DEVICE

[75] Inventor: Shizuo Sumida, Hiroshima, Japan

[73] Assignee: Toyo Kogyo Co., Ltd., Hiroshima, Japan

[21] Appl. No.: 965,692

[22] Filed: Dec. 1, 1978

[30] Foreign Application Priority Data

Dec. 1, 1977 [JP] Japan .......................... 52/161945[U]

[51] Int. Cl.³ ............................................ H03K 21/30
[52] U.S. Cl. ........................... 235/92 DE; 235/92 SH; 235/92 DP
[58] Field of Search ......... 235/92 PE, 92 DE, 92 SH, 235/92 DP; 340/365 R; 364/709, 705

[56] References Cited

U.S. PATENT DOCUMENTS

| 3,681,574 | 8/1972 | Caulkin | 235/92 SH |
| 3,786,475 | 1/1974 | Staar | 235/92 DP |
| 3,976,859 | 8/1976 | Christie et al. | 235/92 PE |
| 4,120,040 | 10/1978 | A ihara | 364/709 |

Primary Examiner—Joseph M. Thesz
Attorney, Agent, or Firm—Wenderoth, Lind & Ponack

[57] ABSTRACT

A data input device for effecting the entry of numerical values into a data processing device includes a data key which is tapped for a number of times corresponding to the number appearing in each digit of the numerical value, a counter for counting the number of taps applied on the data key and for generating a signal indicative of the counted number, a shift key and a shift register for successively memorizing the generated signal from the counter means upon manipulation of the shift key.

7 Claims, 5 Drawing Figures

DATA INPUT DEVICE

BACKGROUND OF THE INVENTION

The present invention relates to a data input device to be coupled with a data processing device for use in automobiles.

Recently, automobiles are equipped with various devices such as a stereo receiver set and a digital clock, and one of most recently developed and handy devices for use in the automobile is a micro-computer or data processing unit which may be used for calculating the mileage of fuel by dividing the consumed fuel by the travelled distance or for calculating the distance of travel available with the remaining fuel by dividing the amount of remaining fuel by the mileage.

For calculating such amounts as described above, it is necessary to provide a data input device having a number of keys to pushed by the driver. Generally, for effecting the entry of the numeral data into the data processing device, a keyboard has ten keys respectively designating the decimal digits 0, 1, 2, ..., and 9, which are selectively pushed by the operator. However, this type of data input device having ten keys for numeral data input has such disadvantages that: (i) the number of keys is too many for the driver to operate when he is driving the automobile; and (ii) the size of the keyboard becomes considerably large.

SUMMARY OF THE INVENTION

Accordingly, it is a primary object of the present invention to provide an improved type of data input device for numeral data input in which the number of keys is less than ten, preferably two or three.

In accordance with a preferred embodiment of the invention, a data input device is constituted by a counter means and a data key for entering numerical values into the counter means one for each tap applied to the data key. The counter means is coupled to the data key for receiving and counting the number of the taps applied to the data key and generating an output signal indicative of the number of the taps counted thereby.

The data input device is further constituted by a shift key, a shift register means and delay means. The shift register means has first and second inputs connected, respectively, to the counter means and to the shift key. When the shift key is manipulated, the shift register means receives the output signal from the counter means. The delay means connected between the shift key and the counter means is provided for applying a reset signal to the counter means a predetermined time interval after the shift key has been manipulated, to reset the counter means.

According to the preferred embodiment of the invention, the shift register means includes at least one memory unit for memorizing the output signal from the counter means. In the example shown, the shift register means includes first, second and third memory units which are connected in series with each other, the first memory unit being connected to the counter means so that, upon manipulation of the shift key, the numerical values carried in the counter means, first memory unit and second memory unit are simultaneously shifted respectively to the first, second and third memory units.

BRIEF DESCRIPTION OF THE DRAWINGS

These and other objects and features of the present invention will become apparent from the following description taken in conjunction with preferred embodiments with reference to the accompanying drawings in which.

DETAILED DESCRIPTION OF THE INVENTION

Figure 1:
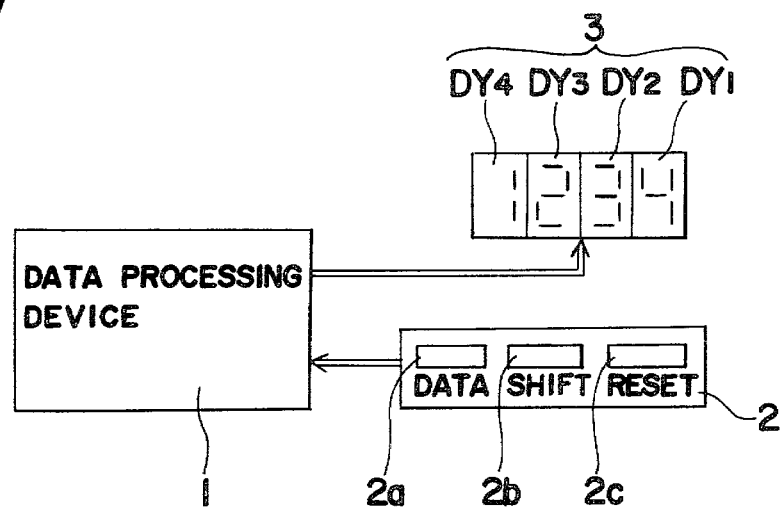
FIG. 1 is a block diagram of a micro-computer employing a data input device of the present invention.

Before the description of the present invention proceeds, it is to be noted that like parts are designated by like reference numerals throughout the accompanying drawings.

Referring to FIG. 1, a micro-computer to be employed in an automobile (not shown) includes a data processing device 1 for effecting arithmetic calculation therein, a data input device 2 for entering the numerical information into the data processing device 1 and a display unit 3. The display unit 3 shown in the example is a 4-digit display including four 7-segment digit display elements $DY_1$, $DY_2$, $DY_3$ and $DY_4$ which are arranged in side-by-side relation to each other. The number of such display elements is not limited to four, but can be less or more than four. However, with the four display elements, a numerical information having four figures at maximum can be displayed.

The data input device 2 according to one embodiment of the present invention includes three keys 2a, 2b and 2c which are labled as "DATA," "SHIFT" and "RESET," respectively. Tha data input device 2 further includes counter means for counting a number of times tapped on the data key 2a and shift register means for shifting the counted number upon pushing of the shift key 2b. While the counter means and shift register means will be described in detail later with particular reference to FIG. 3, the manner in which the data input device 2 is operated to feed numeral information to the data processing device will now be described.

Figure 2:
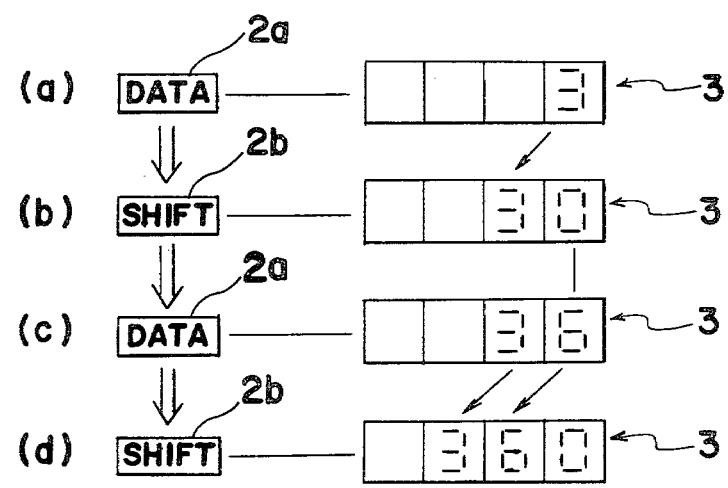
FIG. 2 is an explanatory diagram showing four sequential steps required for three-digit numeral information to be entered into a data processing device.

Referring to FIG. 2, there are shown four steps (a), (b), (c) and (d) for feeding a three-digit number "360" through the data input device 2. Prior to the first step (a), the reset key 2c is pushed to clear all the display elements $DY_1$, $DY_2$, $DY_3$ and $DY_4$ to zero if so required. In the first step (a), the data key 2a is tapped three times for setting a number "3" in the first display element $DY_1$. In the second step (b), the shift key 2b is pushed once for shifting the set number 37 3" from the first display element $DY_1$ to second display element $DY_2$ and for resetting the first display element $DY_1$ to zero. In the third step (c), the data key 2a is tapped six times for setting a number "6" in the first display element $DY_1$. In the last step (d), the shift key 2b is pushed once for shifting the set numbers "3" and "6" from second and first display elements $DY_2$ and $DY_1$ to third and second display elements $DY_3$ and $DY_2$, respectively, and for resetting the first display element $DY_1$ to zero. As a consequence, the number "360" is set in the display unit 3 while fed to the data processing device 1.

A detailed circuitry of the data input device 2 according to one embodiment of the present invention will be described hereinbelow.

Figure 3:
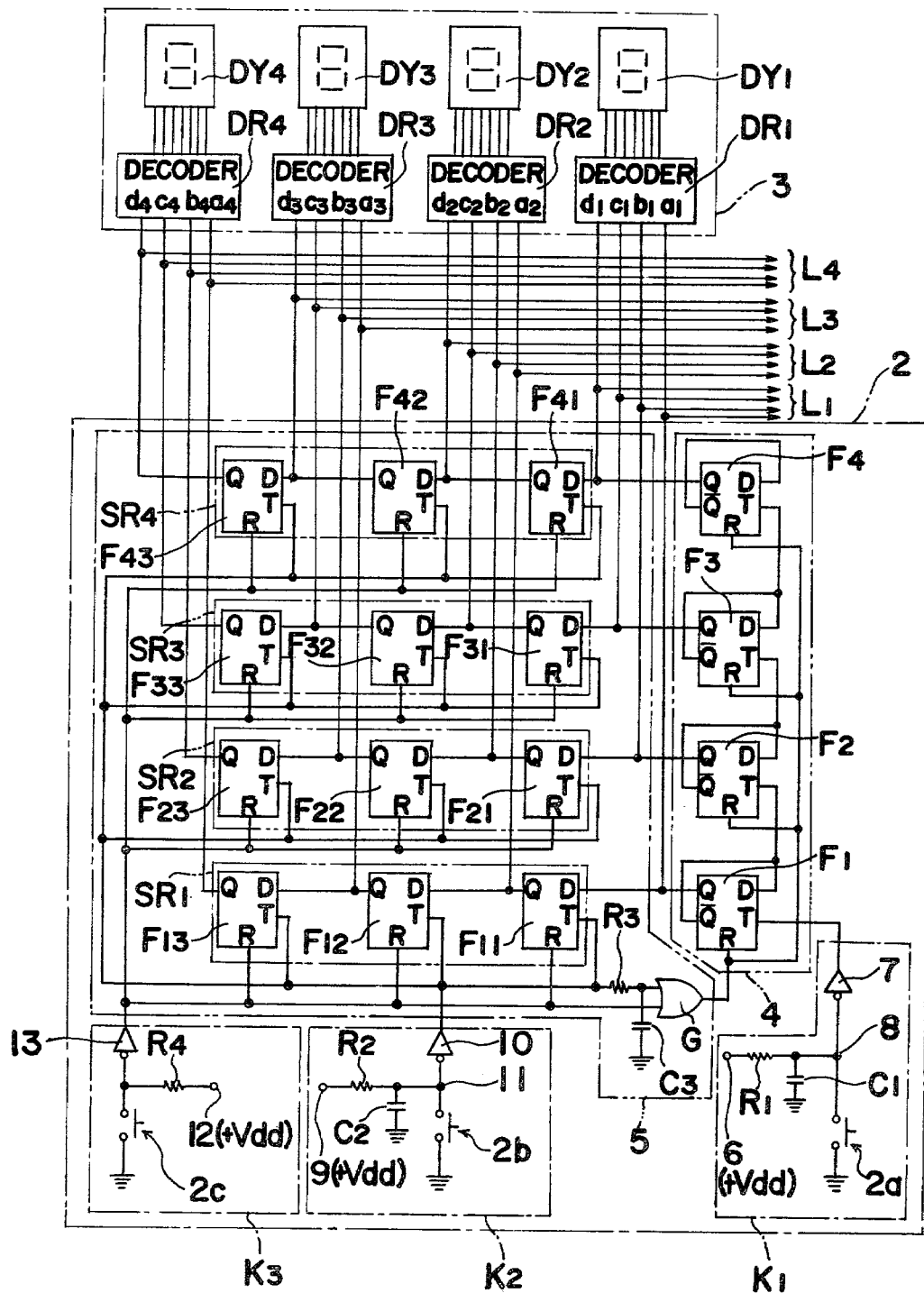
FIG. 3 is a circuit diagram of a data input device according to one embodiment of the present invention.

Referring to FIG. 3, the data input device 2 is enclosed by the single dot chain line while the data key 2a, shift key 2b and reset key 2c are shown in the form of normally opened, push-button switches, respectively. The counter means 4 and shift register means 5 are enclosed by the double dot chain lines.

The counter means 4 comprises four data latch elements $F_1$, $F_2$, $F_3$ and $F_4$. Each of the data latch elements has five terminals which are data terminal D, trigger terminal T, first output terminal Q, second output terminal $\overline{Q}$ and reset terminal R.

In the first data latch element $F_1$, the data terminal D is connected to the second output terminal $\overline{Q}$ and also to a trigger terminal T of the neighboring data latch element $F_2$. The trigger terminal T of the first data latch element $F_1$ is connected to an inverter 7 which is contained in a pulse producing circuit $K_1$ described in detail later. In the second data latch element $F_2$, the data terminal D is connected to the second output terminal $\overline{Q}$ and also to the trigger terminal T of the neighboring data latch element $F_3$. Similarly, in the third data latch element $F_3$, the data terminal D is connected to the second output terminal $\overline{Q}$ and also to the trigger terminal T of the neighboring data latch element $F_4$. In the fourth data latch element $F_4$, the data terminal D is connected to the second output terminal $\overline{Q}$.

The pulse producing circuit $K_1$ comprises the inverter 7 and the data key 2a which are connected in series between the trigger terminal T of the first data latch element $F_1$ and the ground. As is apparent from FIG. 3, the data key 2a, as well as other keys 2b and 2c, is a normally open switch and is adapted to be closed upon manipulation thereof. A junction 8 between the inverter 7 and the data key 2a is connected through a resistor $R_1$ to a power receiving terminal 6 where voltage +Vdd is applied. A capacitor $C_1$ is connected in parallel to the data key 2a for eliminating noises which may be produced at the junction 8 when the data key 2a is repeatedly tapped, thereby ensuring generation of one pulse per tap on the key 2a.

Each time the data key 2a is tapped, the trigger terminal T of the first latch element $F_1$ receives a trigger pulse. Therefore, a train of such trigger pulses applied to the counter means 4, as a result of successive tapping of the data key 2a, sequentially steps up the number set in the counter means 4 by means of binary digit obtained from the output terminals Q of the respective latch elements $F_1$, $F_2$, $F_3$ and $F_4$. For example, a combination of binary signals (0,0,1,1) from the output terminals Q of the latch elements $F_1$, $F_2$, $F_3$ and $F_4$ represent numeral "3."

The shift register means 5 comprises four sets of shift registers $SR_1$, $SR_2$, $SR_3$ and $SR_4$, each shift register including three data latch elements. More particularly, the shift register $SR_1$ includes data latch elements $F_{11}$, $F_{12}$ and $F_{13}$; the shift register $SR_2$ includes data latch elements $F_{21}$, $F_{22}$ and $F_{23}$; the shift register $SR_3$ includes data latch elements $F_{31}$, $F_{32}$ and $F_{33}$; and the shift register $SR_4$ includes data latch elements $F_{41}$, $F_{42}$, and $F_{43}$. Each of the data latch elements contained in the shift registers $SR_1$ to $SR_4$ has a data terminal D, a trigger terminal T, an output terminal Q and a reset terminal R. The data terminals D of the data latch elements $F_{11}$, $F_{21}$, $F_{31}$ and $F_{41}$ are respectively connected to the first output terminals Q of the data latch elements $F_1$, $F_2$, $F_3$ and $F_4$. Similarly, the data terminals D of the data latch elements $F_{12}$, $F_{22}$, $F_{32}$ and $F_{42}$ are respectively connected to the output terminals Q of the data latch elements $F_{11}$, $F_{21}$, $F_{31}$ and $F_{41}$. Likewise, the data terminals D of the data latch elements $F_{13}$, $F_{23}$, $F_{33}$ and $F_{43}$ are respectively connected to the output terminals Q of the data latch elements $F_{12}$, $F_{22}$, $F_{32}$ and $F_{42}$.

The trigger terminals T of the respective data latch elements contained in the shift registers $SR_1$ to $SR_4$ are connected to each other and, in turn, to an inverter 10 of a pulse producer $K_2$, while the reset terminals R of the respective data latch elements contained in the shift registers $SR_1$ to $SR_4$ are connected to each other and, in turn, to an inverter 13 of a pulse producer $K_3$. The pulse producer $K_2$ comprises the inverter 10, the shift key 2b, a resistor $R_2$ and a capacitor $C_2$ which are connected in a similar manner to the pulse producer $K_1$. The pulse producer $K_3$ comprises the inverter 13 and the reset key 2c connected in series and a resistor $R_4$ connected between a junction of the inverter 13 with the reset key 2c and a terminal 12 for receiving voltage +Vdd.

Each time the trigger terminals T of the respective data latch elements in the shift registers $SR_1$ to $SR_4$ receives pulses from the pulse producing circuit $K_2$, as a result of pushing the shift key 2b, the binary signals contained in the data latch elements $F_1$, $F_2$, $F_3$ and $F_4$ of the counter means 4 are shifted to the data latch elements $F_{11}$, $F_{21}$, $F_{31}$ and $F_{41}$. Likewise, the binary signals contained in the data latch elements $F_{11}$, $F_{21}$, $F_{31}$ and $F_{41}$ are shifted to the data latch elements $F_{12}$, $F_{22}$, $F_{32}$ and $F_{42}$ and, in a similar manner, the binary signals in the data latch elements $F_{12}$, $F_{22}$, $F_{32}$ and $F_{42}$ are shifted to the data latch elements $F_{13}$, $F_{23}$, $F_{33}$ and $F_{34}$, at the same time.

Since the data latch elements aligned in one column, for example, the data latch elements $F_{11}$, $F_{21}$, $F_{31}$ and $F_{41}$ aligned in the first column are so corrected as to simultaneously memorize the transmitted signal, it can be said that the shift register means 5 comprises three sets of memory units connected in series in which the first memory unit located at one end of the series is connected to the counter means 4. Therefore, upon receipt of signal from the shift key 2b as a result of pushing of the shift key 2b, the numeral information contained in the counter means 4 is shifted to the first memory unit while the numeral information contained in each of the memory units is shifted to the neighboring memory unit which is remote from the counter means 4.

The pulse produced from the pulse producer $K_2$ is supplied to one of two inputs of an OR gate G through a resistor $R_3$ while the pulse produced from the pulse producer $K_3$ is supplied to the other input of the OR gate G. Said one input of the OR gate G is grounded through a capacitor $C_3$ forming a part of an integral circuit constituted together with the resistor $R_3$. The output from the OR gate G is connected to the reset terminal R of all the data latch elements $F_1$, $F_2$, $F_3$ and $F_4$ contained in the counter means 4. Therefore, the data latch elements $F_1$, $F_2$, $F_3$ and $F_4$ in the counter means 4 are reset immediately after the pulse has been produced from the pulse producer $K_3$, or after the pulse has been produced from the pulse producer $K_2$ at a predetermined interval of time defined by the integral circuit of resistor $R_3$ and capacitor $C_3$. This time interval is necessary because the reset of the data latch elements $F_1$, $F_2$, $F_3$ and $F_4$ must be effected after the data in the latch elements $F_1$, $F_2$, $F_3$ and $F_4$ has been properly shifted to the shift means 5.

The output terminals Q of the data latch elements $F_1$, $F_2$, $F_3$ and $F_4$ are connected to four inputs $a_1$, $b_1$, $c_1$ and $d_1$ of a 7-segment decoder $DR_1$ which is coupled to the 7-segment display element $DY_1$. In a similar manner, the output terminals Q of the data latch elements $F_{11}$, $F_{21}$, $F_{31}$ and $F_{41}$ are connected to four inputs $a_2$, $b_2$, $c_2$ and $d_2$ of a 7-segment decoder $DR_2$ which is coupled to the 7-segment display element $DY_2$. Furthermore, the output terminals Q of the data latch elements $F_{12}$, $F_{22}$, $F_{32}$ and $F_{42}$ are connected to four inputs $a_3$, $b_3$, $c_3$ and $d_3$ of a 7-segment decoder $DR_3$ which is coupled to the 7-segment display element $DY_3$. Likewise, the output terminals Q of the data latch elements $F_{13}$, $F_{23}$, $F_{33}$ and $F_{43}$ are connected to four inputs $a_4$, $b_4$, $c_4$ and $d_4$ of a 7-segment decoder $DR_4$ which is coupled to the 7-segment display element $DY_4$. Therefore, the numeral information set in the counter means 4 and shift register means 5 can be displayed through a display unit 3 in a viewable form.

For utilizing the numeral information, the above described output terminals are connected to the data processing device 1 through bundles of wires $L_1$, $L_2$, $L_3$ and $L_4$.

The operation of the data input device shown in FIG. 3 for feeding, as one example, numeral information "360" is described hereinbelow correspondingly to the four steps (a) to (d) described above.

Prior to the first step (a), the reset key 2c is pushed for producing a high level binary signal from the inverter 13, so that all the latch elements in the counter means 4 and shift register means 5 are set to zero. In the first step (a), the data key 2a is tapped three times for stepping up the number in the counter means 4 up to numeral "3." Therefore, the combination of binary signals (0,0,1,1) would be produced from the output terminals Q of the data latch elements $F_1$, $F_2$, $F_3$ and $F_4$, while the numeral "3" is displayed in the first 7-segment display element $DY_1$.

In the second step (b), the shift key 2b is pushed for producing a pulse signal from the inverter 10. The pulse signal so produced from the inverter 10 is applied to the trigger terminals T of all the data latch elements included in the shift registers $SR_1$, $SR_2$, $SR_3$ and $SR_4$ for shifting the numeral information contained in the counter means 4 into the shift register means 5. In this example, the numeral information of binary signals (0,0,1,1) contained in the data latch elements $F_1$, $F_2$, $F_3$ and $F_4$ is shifted to the data latch elements $F_{11}$, $F_{21}$, $F_{31}$ and $F_{41}$, whereby the second 7-segment display element $DY_2$ displays the numeral "3." On the other hand, the pulse produced from the inverter 10 is also applied to the integral circuit of resistor $R_3$ and capacitor $C_3$ in which the pulse is integrated in the capacitor $C_3$. When the voltage level across the capacitor $C_3$ reaches a predetermined level, the OR gate G is actuated to produce a high level signal from the output terminal thereof. This output signal is supplied to the reset terminals R of the data latch elements $F_1$, $F_2$, $F_3$ and $F_4$ in the counter means 4 for resetting the latch elements $F_1$, $F_2$, $F_3$ and $F_4$ to zero whereby the display element $DY_1$ displays "0." In this manner the resetting of the latch elements $F_1$, $F_2$, $F_3$ and $F_4$ can be effected after the numeral information in the latch elements $F_1$, $F_2$, $F_3$ and $F_4$ has been shifted to the shift register means 5.

In the third step (c), the data key 2a is tapped six times for stepping up the number in the counter means 4 up to numeral "6." Therefore, the combination of binary signals (0,1,1,0) would be set in the data latch elements $F_1$, $F_2$, $F_3$ and $F_4$, while the numeral "6" is displayed in the first 7-segment display element $DY_1$.

In the last step (d), the shift key 2b is pushed for shifting the numeral information contained in the counter means 4 into the shift register means 5 in a similar manner described above in the second step (b). In this example, the numeral information of binary signals (0,0,1,1) contained in the data latch elements $F_{11}$, $F_{21}$, $F_{31}$ and $F_{41}$ is shifted to the data latch elements $F_{12}$, $F_{22}$, $F_{32}$ and $F_{42}$ while the numeral information of binary signals (0,1,1,0) contained in the data latch elements $F_1$, $F_2$, $F_3$ and $F_4$ is shifted to the data latch elements $F_{11}$, $F_{21}$, $F_{31}$, $F_{41}$. In addition, the OR gate G is actuated in this step in a similar manner to that described above for resetting the latch elements $F_1$, $F_2$, $F_3$ and $F_4$. As a consequence, the display elements $DY_1$, $DY_2$ and $DY_3$ display "0," "6" and "3," respectively, for presenting a numeral "360."

The numeral information so displayed can be supplied to the data processing device 1 when a suitable switch (not shown) is turned on, which switch may be coupled with the reset key 2c or may be incorporated in the data processing device 1.

It is needless to say that the data input device according to the embodiment described above can display a 4-digit figure up to "9999."

Figure 4:
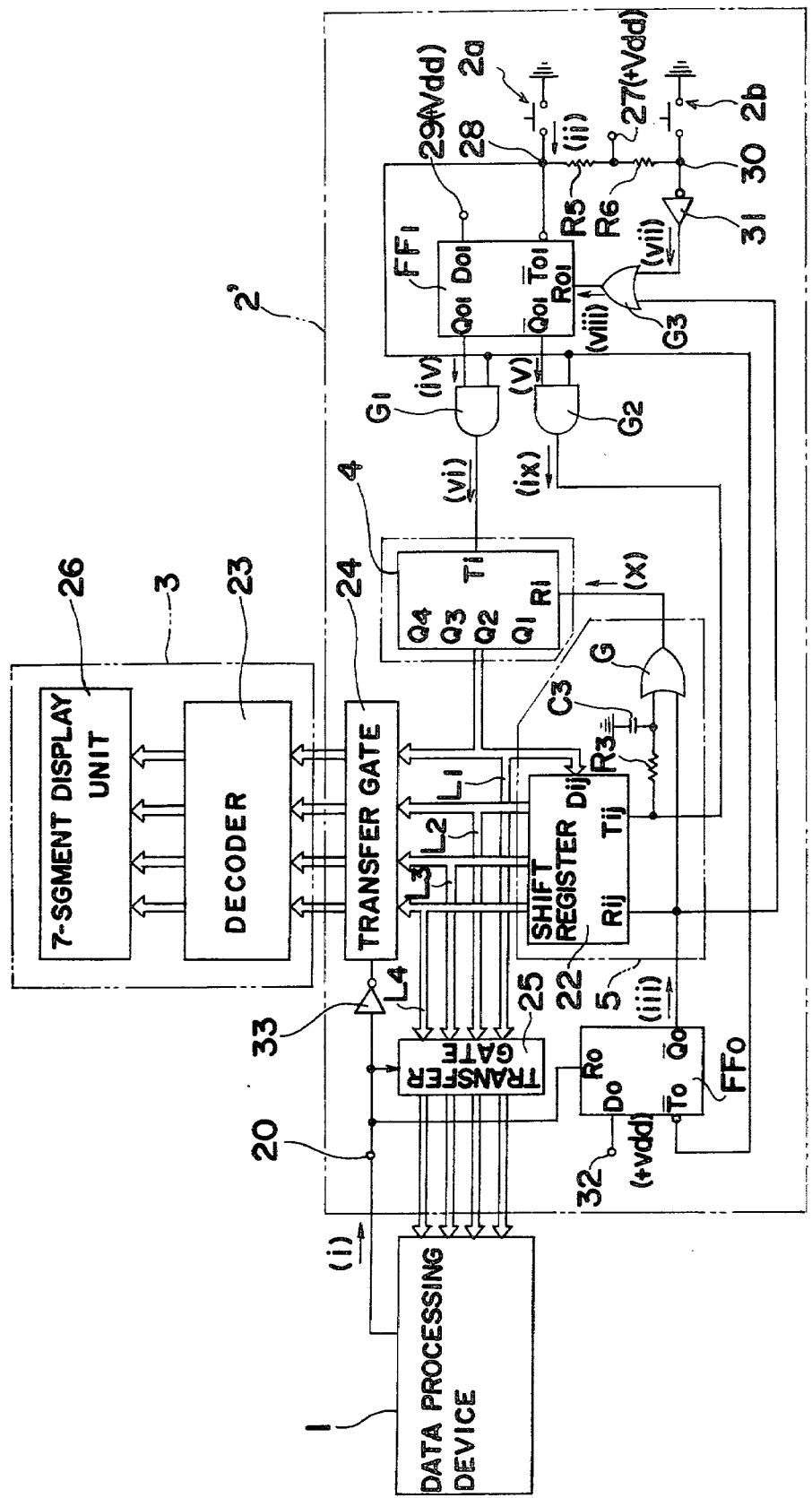
FIG. 4 is a circuit diagram of a data input device according to another embodiment of the present invention.

Referring to FIG. 4, there is shown a block diagram of a modified form of the data input device 2 shown in FIG. 3.

The data input device 2' comprises a D-flip-flop circuit $FF_1$ having terminals $Q_{01}$, $\overline{Q}_{01}$, $D_{01}$, $\overline{T}_{01}$ and $R_{01}$, the data terminal $D_{01}$ being adapted to receive a voltage $+Vdd$, and a D-flip-flop circuit $FF_0$ having terminals $Q_0$, $\overline{Q}_0$, $D_0$, $\overline{T}_0$ and $R_0$, the data terminal $D_0$ being adapted to receive the voltage $+Vdd$. In the D-flip-flop circuit $FF_1$, the trigger terminal $\overline{T}_{01}$ is connected through a junction 28 to the data key 2a which is in turn connected to the ground. The junction 28 is also connected to the shift key 2b through series-connected resistors $R_5$ and $R_6$. The other end of the shift key 2b is grounded. A junction between the resistors $R_5$ and $R_6$ is supplied with voltage $+Vdd$ through a terminal 27. A junction 30 between the resistor $R_6$ and the shift key 2b is connected to an inverter 31 which is in turn connected to one input of a pair of inputs of an OR gate $G_3$. The other input of the OR gate $G_3$ is connected to the output terminal $\overline{Q}_0$ of the D-flip-flop circuit $FF_0$. The output of the OR gate $G_3$ is connected to the reset terminal $R_{01}$ of the D-flip-flop $FF_1$. The output terminals $Q_{01}$ and $\overline{Q}_{01}$ of the D-flip-flop $FF_1$ are connected to one input of an AND gate $G_1$ and one input of AND gate $G_2$, respectively. The other inputs of the AND gates $G_1$ and $G_2$ are connected to the junction 28 and also to the trigger terminal $\overline{T}_0$ of the D-flip-flop $FF_0$.

It is to be noted that, in FIG. 4, the counter 4 is shown in a simplified form because it is of the same construction as that shown in FIG. 3, it being to be understood that reference character Ti corresponds to the trigger terminal T of the first data latch element shown in FIG. 3, reference character $R_i$ corresponds to any one of the reset terminals R of the respective data latch elements $F_1$ to $F_4$ and reference characters $Q_1$, $Q_2$, $Q_3$ and $Q_4$ correspond, respectively, to the output terminals Q of the associated data latch elements $F_1$ to $F_4$. Likewise, the shift registers $SR_1$ to $SR_4$ are shown in a simplified form in which the reference characters Dij, Tij and Rij correspond to any one of the data terminal D, trigger terminal T and reset terminal R of the respective data latch elements contained in the shift registers $SR_1$ to $SR_4$.

In FIG. 4, the output of the AND gate $G_1$ is connected to the trigger terminal Ti of the 4-bit binary counter 4 while the output of the AND gate $G_2$ is connected to the trigger terminal Tij of the shift register 22. The trigger terminal Tij of the shift register 22 is connected to one input of the OR gate G through the integrator circuit of resistor $R_3$ and capacitor $C_3$ while the output of the OR gate G is connected to the reset terminal Ri of the counter 4 in a manner similar to that described above. The other input of the OR gate G is connected to the output terminal $\overline{Q}_0$ of the flip-flop $FF_0$ and also to the reset terminal Rij of the shift register 22. The outputs $Q_1$, $Q_2$, $Q_3$ and $Q_4$ of the counter 4 are connected to the shift register 22 in the same manner as described above. The binary signals produced from the shift register 22 and counter 4 are supplied through a transfer gate 24 to a decoder 23 which corresponds to the decoders $DR_1$, $DR_2$, $DR_3$ and $DR_4$ in the foregoing embodiment, and also are connected through a transfer gate 25 to the data processing device 1 by way of bundles of wires $L_1$, $L_2$, $L_3$ and $L_4$. The decoder 23 is coupled to a 7-segment display unit 26 which corresponds to the 7-segment display elements $DY_1$, $DY_2$, $DY_3$ and $DY_4$ in the foregoing embodiment. A terminal 20 for receiving a mode signal from the data processing device 1 is connected to the transfer gate 25 and also to the reset terminal $R_0$ of the flip-flop $FF_0$. The terminal 20 is further connected through an inverter 33 to the transfer gate 24. The mode signal from the data processing device 1 is in the form of a binary signal. When the mode signal is high, the flip-flop $FF_0$ is reset for producing a high level signal from the output terminal $\overline{Q}_0$ and, at the same time, the transfer gate 25 is opened while the transfer gate 24 is closed. The high level signal produced from the output terminal $\overline{Q}_0$ resets the shift register 22, counter 4 and flip-flop $FF_1$ for preventing the counter 4 from counting any input signal.

The operation of the data input device 2' shown in FIG. 4 will now be described hereinbelow as applied in inputting a numerical information of a figure "360," with reference to FIG. 2.

When the mode signal produced from the data processing device 1 is a high level signal, the flip-flop $FF_0$ is in the reset condition for producing a high level signal from the output terminal $\overline{Q}_0$. Therefore, the data input device 2' is in a reset condition for preventing any signal from being fed therethrough. Thereafter, the mode signal changes its state from high to low at a moment $T_0$ shown in FIG. 5. The waveform of the mode signal is shown by a graph (i) in FIG. 5.

Figure 5:
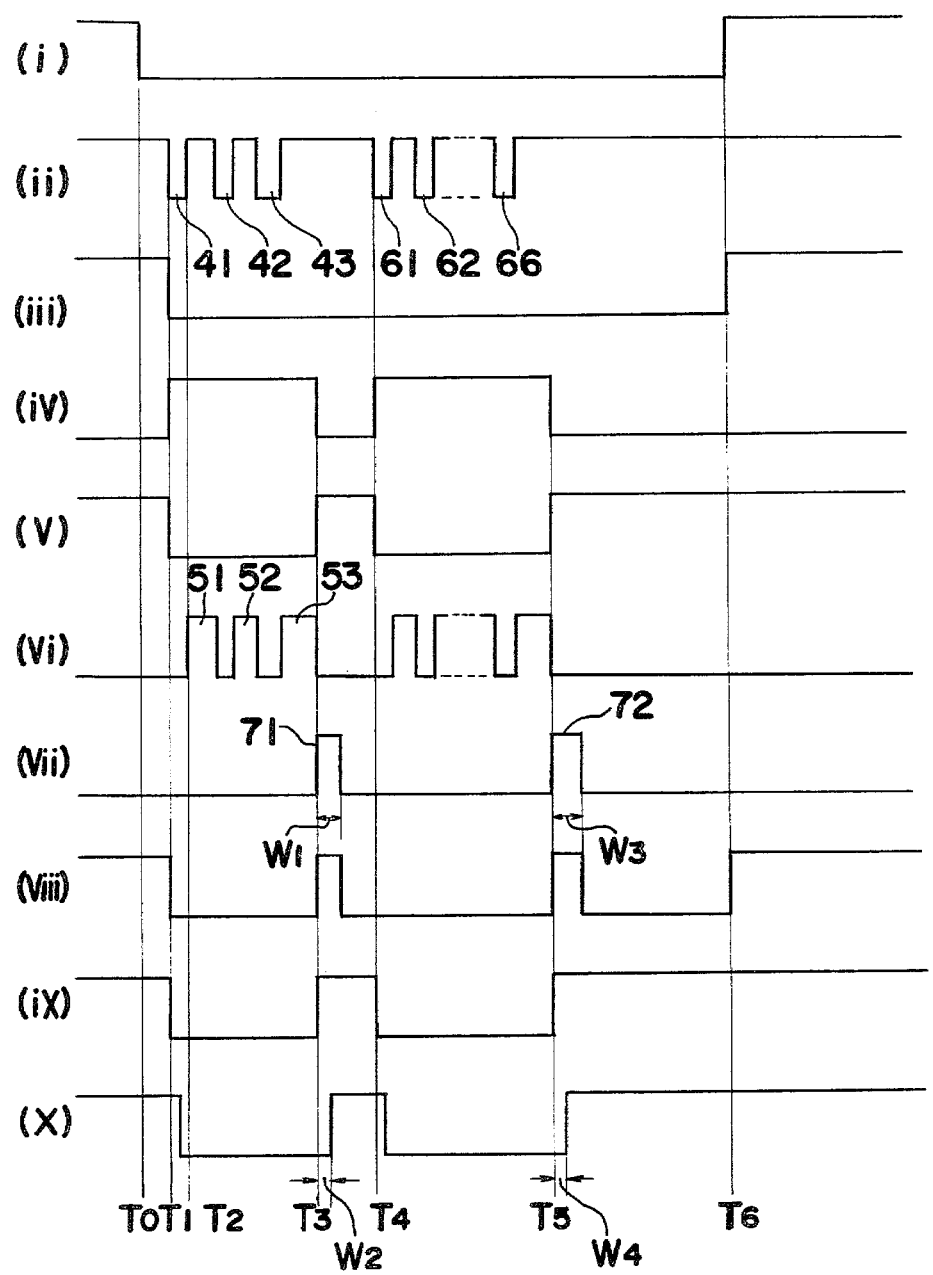
FIG. 5 is a graph showing waveforms of signals obtained from various points in the circuit shown in FIG. 4.

In the first step (a), the data key 2a, in this example, is tapped three times for producing a train of three negative going pulses 41, 42 and 43, as shown in graph (ii) of FIG. 5. These three negative going pulses 41, 42 and 43 are applied to the trigger terminals $\overline{T}_0$ and $\overline{T}_{01}$ of the flip-flops $FF_0$ and $FF_1$, respectively. The receipt of the first negative going pulse 41 to the flip-flop $FF_0$, more particularly, the step down of the negative going pulse 41, causes the flip-flop $FF_0$ to reverse its condition so that the signal produced from the output terminal $\overline{Q}_0$ is changed at a moment $T_1$ from high to low, as shown by a graph (iii) in FIG. 5, thereby allowing the data to be fed through the counter 4 and the shift register 22. More particularly, the change in state of signal from the output terminal $\overline{Q}_0$ at the moment $T_1$ from high to low causes the OR gate $G_3$ to change its output from high to low level signal as shown by a graph (viii). Similarly, the receipt of the first negative going pulse 41 to the flip-flop $FF_1$ causes the flip-flop $FF_1$ to reverse its condition, so that the signal produced from the output terminal $\overline{Q}_{01}$ is changed at the moment $T_1$ from low to high, as shown by a graph (iv), and that the signal produced from the output terminal $\overline{Q}_{01}$ is changed at the moment $T_1$ from high to low, as shown by a graph (v) in FIG. 5. The high level signal (graph (iv)) produced from the terminal $Q_{01}$ enables the AND gate $G_1$ to transmit the pulses 41, 42 and 43 to the counter 4. Note that the pulses 41, 42 and 43 are reversed and shifted in the AND gate $G_1$. Therefore, the AND gate $G_1$ produces pulses 51, 52 and 53, as shown by graph (vi), upon receipt of the pulses 41, 42 and 43. Furthermore, the low level signal (graph (v)) produced from the terminal $\overline{Q}_{01}$ causes the AND gate $G_2$ to produce a low level signal as shown by a graph (ix) in FIG. 5. Such low level signal (graph (ix)) together with the low level signal (graph (iii)) produced from the terminal $\overline{Q}_0$ of the flip-flop $FF_0$ cause the OR gate G to produce a low level signal at a moment slightly after the moment $T_1$, as shown by a graph (x). Such delay is caused by the integral circuit of resistor $R_3$ and capacitor $C_3$ connected to the OR gate G.

The three pulses 51, 52 and 53 applied to the trigger terminal Ti steps up the counter 4 up to three. Therefore, the combination of binary signals produced from the output terminals $(Q_1, Q_2, Q_3, Q_4)$ is (1,1,0,0). Since the transfer gate 24 receives a high level signal from the inverter 33 while the transfer gate 25 receives a low level signal from the terminal 20, the output signals from the terminals $Q_1$, $Q_2$, $Q_3$ and $Q_4$ are directed only to the decoder 23 which thereupon actuates the 7-segment display unit 26 to display the numeral "3."

In the second step (b), the shift key 2b is pushed for a period $W_1$ for producing a positive pulse 71 from the inverter 31, as shown by a graph (vii). As a result, the OR gate $G_3$ produces a positive pulse (graph (viii)) coinciding with the pulse 71, which is applied to the reset input $R_{01}$ of the flip-flop $FF_1$ for inverting the condition of the flip-flop $FF_1$. Such change in state of the flip-flop $FF_1$ results in generation of a low level signal from the output $Q_{01}$ and a high level signal from the output $\overline{Q}_{01}$. At this moment, since the AND gate $G_2$ receives a high level signal (graph (ii)) from the terminal 28 as a result of opening of the data key 2a, the output signal (graph (ix)) from the AND gate $G_2$ is turned from a low to a high level signal at the moment $T_3$ for triggering the shift register 22. As a consequence, the combination of binary signals appearing at the terminals $Q_1$, $Q_2$, $Q_3$ and $Q_4$ of the counter 4 are simultaneously shifted to the shift register 22 in the manner described above and are in turn, used for the display. In addition, the high level signal at the moment $T_3$ from the AND gate $G_2$ is also applied to the input of the OR gate G through the integrating circuit of resistor $R_3$ and capacitor $C_3$, so as to actuate the OR gate G to produce a high level signal (graph (x)) after a delay period of $W_2$. This high level signal from the OR gate G is applied to the reset terminal Ri of the counter 4 for turning all the output from the terminals $Q_1$, $Q_2$, $Q_3$ and $Q_4$ to zero. Thus, the display unit 26 now shows a numeral "30."

In the third step (c), the data key 2a is tapped six times for producing a train of six negative going pulses 61 to 66 from the terminal 28. Such negative going pulses are reversed and shifted in the AND gate $G_1$ and, in turn, applied to the counter 4 for setting a combination of binary signals (0,1,1,0) at the output terminals ($Q_1,Q_2,Q_3,Q_4$). Thus, the display unit 26 shows a numeral "36" in the manner described above.

In the last step (d), the shift key 2b is pushed for a period $W_3$ after the moment $T_5$ for producing a positive pulse 72 from the inverter 31 as shown by a graph (vii). As a result, the OR gate $G_3$ produces a positive pulse (graph (viii)) coinciding with the pulse 71 towards the reset input $R_{01}$ of the flip-flop $FF_1$ for inverting the condition of the flip-flop $FF_1$. As a consequence, the high level signal (graph (ix)) produced from the AND gate $G_2$ shifts the numeral information contained in the shift register 22, and after a delay period $W_4$, the same actuates the OR gate G to reset the counter 4. Thus, the display unit 26 now shows a numeral "360."

After the four sequential steps have been completed to enter the numerical information representative of the figure "360" in the input device 2', the data processing device 1 produces, at a moment $T_6$, a high level mode signal (graph (i)). Accordingly, the transfer gate 24 is opened for transferring the binary signal carrying information of "360" to the data processing device 1 through the lead lines $L_1$, $L_2$, $L_3$ and $L_4$. At the same time, the transfer gate 25 is closed while the flip-flop $FF_0$ is reset for resetting the data input device 2'.

According to the embodiment shown in FIG. 4, the data input device 2' can be controlled by two keys 2a and 2b for setting and inputting numeral data.

Since the data input device of the present invention has a smaller number of control keys, a relatively small space is required for the installation of the keyboard and the operation of the data input device is also simplified.

Although the present invention has been fully described by way of examples with reference to the accompanying drawings, various changes and modifications are apparent to those skilled in the art. For example, the counter 4 and shift register 22 may be of any known construction. Furthermore, the number of digits capable of being displayed by the display unit is not limited to four, but may be less or more than four digits. In the case where the number of digits displayed by the display unit exceeds four, the shift register 22 must have a large capacity sufficient to store all the numeral information. Therefore, these changes and modifications are, unless they depart from the true scope of the present invention, to be understood as included therein.

What we claim is:

1. A data input device to be coupled with a data processing device for use in a vehicle, said data input device comprising:
   counter means;
   a data key for entering numerical values into said counter means one for each tap applied to said data key;
   said counter means being coupled to said data key for receiving and counting the number of the taps applied to said data key and for generating an output signal indicative of the number of the taps counted thereby;
   a shift key;
   shift register means including a plurality of memory units connected in series with each other and having first and second inputs connected respectively to said counter means and said shift key, so that, upon manipulation of said shift key, the numerical values carried in said counter means and in each of said memory units are simultaneously shifted to respective next adjacent said memory units in said series of memory units;
   delay means connected between said shift key and said counter means for applying a reset signal to said counter means a predetermined time interval after said shift key has been manipulated, to reset said counter means; and
   means for applying the numerical values obtained from said shift register means and from said counter means to a data processing device.

2. A data input device as claimed in claim 1, wherein said plurality of memory units of said shift register means comprises first, second and third memory units connected in series with each other, said first memory unit being also connected to said counter means, so that, upon said manipulation of said shift key, the numerical values carried in said counter means, said first memory unit and said second memory unit are simultaneously shifted respectively to said first, second and third memory units.

3. A data input device as claimed in claim 1, wherein said applying means includes a first data transferring passage.

4. A data input device as claimed in claim 3, wherein said applying means further includes a first transfer gate means provided in said first data transferring passage for opening and closing said passage.

5. A data input device as claimed in claim 1, further comprising a display means coupled to said counter means and to said shift register means through a second data transferring passage for displaying data carried in said counter means and shift register means.

6. A data input device as claimed in claim 5, further comprising a second transfer gate means provided in said second data transferring passage for opening and closing said passage.

7. A data input device as claimed in claim 1, further comprising a reset key coupled to said counter means and to said shift register means for resetting both of said counter means and said shift register means upon manipulation of said reset key.

* * * * *